(12) United States Patent
Zhu et al.

(10) Patent No.: US 11,957,013 B2
(45) Date of Patent: Apr. 9, 2024

(54) DISPLAY PANEL AND DISPLAY DEVICE FOR IVL TESTING

(71) Applicant: BOE TECHNOLOGY GROUP CO., LTD., Beijing (CN)

(72) Inventors: Zhijian Zhu, Beijing (CN); Pengcheng Lu, Beijing (CN); Yu Ao, Beijing (CN); Yunlong Li, Beijing (CN); Yuanlan Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 614 days.

(21) Appl. No.: 17/260,248

(22) PCT Filed: Mar. 27, 2020

(86) PCT No.: PCT/CN2020/081858
§ 371 (c)(1),
(2) Date: Jan. 14, 2021

(87) PCT Pub. No.: WO2021/189486
PCT Pub. Date: Sep. 30, 2021

(65) Prior Publication Data
US 2022/0140051 A1 May 5, 2022

(51) Int. Cl.
*H10K 59/131* (2023.01)
*G09G 3/00* (2006.01)
*H10K 50/844* (2023.01)

(52) U.S. Cl.
CPC ........... *H10K 59/131* (2023.02); *G09G 3/006* (2013.01); *H10K 50/844* (2023.02)

(58) Field of Classification Search
CPC .... H10K 59/131; H10K 50/844; H10K 71/70; H10K 59/1213; G09G 3/006; H01L 22/00; H01L 23/544
USPC .......................................................... 257/40
See application file for complete search history.

(56) References Cited

U.S. PATENT DOCUMENTS

| | | | |
|---|---|---|---|
| 2003/0122975 A1* | 7/2003 | Kim | G02F 1/1309 349/40 |
| 2009/0321120 A1 | 12/2009 | Hiramoto et al. | |
| 2016/0043010 A1* | 2/2016 | Kwak | H01L 22/14 438/15 |
| 2016/0204181 A1* | 7/2016 | So | H10K 50/84 438/4 |
| 2018/0226467 A1* | 8/2018 | Ka | H01L 22/34 |
| 2019/0197930 A1 | 6/2019 | Kim et al. | |

(Continued)

OTHER PUBLICATIONS

Non-Final Office Action for U.S. Appl. No. 17/954,377 dated Oct. 4, 2023.

*Primary Examiner* — Duy T Nguyen
(74) *Attorney, Agent, or Firm* — Perilla Knox & Hildebrandt LLP; Kenneth A. Knox (57) ABSTRACT

A display panel includes: a silicon-based substrate, a driving layer, a first electrode layer, an organic light emitting layer, a second electrode layer and a plurality of pads. The display signal access pad is configured to access the display signal during a display phase, the test signal access pad at least includes a first group of test phase access pads, and the first group of test phase access pads includes a first pad and a second pad, the first pad is electrically connected with the electrode ring, and the second pad is electrically connected with the silicon-based substrate.

20 Claims, 4 Drawing Sheets

(56) References Cited

U.S. PATENT DOCUMENTS

| 2019/0198582 A1* | 6/2019 | Yeo | H10K 59/88 |
| 2020/0185483 A1* | 6/2020 | Peng | G01R 31/2884 |
| 2020/0192524 A1* | 6/2020 | Lee | G01R 27/2605 |

* cited by examiner

DISPLAY PANEL AND DISPLAY DEVICE FOR IVL TESTING

CROSS-REFERENCE TO RELATED APPLICATION

This application is based upon and claims priority to International Application No. PCT/CN2020/081858, filed on Mar. 27, 2020, the entire contents thereof are incorporated herein by reference.

TECHNICAL FIELD

The present disclosure relates to the field of display technology, and in particular to a display panel and a display device.

BACKGROUND

Organic Light Emitting Display (OLED) display devices have many advantages such as self-luminous, low driving voltage, high luminous efficiency, short response time, high definition and contrast, close to 180° viewing angle, wide operating temperature range, and can achieve flexible display and large-area and full-color display and the like, and are considered to be the most promising new generation display technology. However, the OLED display devices are developing towards miniaturization.

SUMMARY

According to one aspect of the present disclosure, a display panel is provided, the display panel including:

A silicon-based substrate, including a display region and a peripheral region surrounding the display region.

A driving layer, formed in the silicon-based substrate, and including a plurality of first transistors located in the display region.

A first electrode layer, disposed on a side of the driving layer away from the silicon-based substrate, and including a plurality of first electrodes located in the display region, and each of the first electrodes is electrically connected to each of the first transistors.

An organic light emitting layer, disposed on a side of the first electrode layer away from the driving layer.

A second electrode layer, disposed on a side of the organic light emitting layer away from the driving layer, and including a second electrode located in the display region and an electrode ring located in the peripheral region, the electrode ring is configure to surround the second electrode and is connected to the second electrode;

A plurality of pads, located in the peripheral region at at least one side of the display region, the plurality of pads including a display signal access pad and a test signal access pad, and the test signal access pad is located at both sides of the display signal access pad.

The display signal access pad is configured to access the display signal during a display phase, and the test signal access pad is configured to access the test signal during a test phase, the test signal access pad at least including a first group of test phase access pads, and the first group of test phase access pads including a first pad and a second pad, the first pad is electrically connected with the electrode ring, and the second pad is electrically connected with the silicon-based substrate.

In an exemplary embodiment of the present disclosure, each of the first transistors includes an active region formed in the silicon-based substrate, two doped regions located in the active region, a channel region located between the two doped regions, and a gate electrode located on the channel region, the two doped regions respectively form a first pole and a second pole, and the second pad is electrically connected to the active region of each of the first transistors.

In an exemplary embodiment of the present disclosure, the test signal access pad also includes a second group of test phase access pads, and the second group of test phase access pads include a third pad and a fourth pad, the third pad is electrically connected to the electrode ring, and the fourth pad is electrically connected to the silicon-based substrate.

In an exemplary embodiment of the present disclosure, the peripheral region includes a bonding area, the third pad, the fourth pad and a plurality of display signal access pads are located in the bonding area.

In an exemplary embodiment of the present disclosure, the first pad and the third pad are located on a same side of the display signal access pad, and the second pad and the fourth pad are located on the other side of the display signal access pad.

In an exemplary embodiment of the present disclosure, the third pad and the fourth pad are respectively arranged adjacent to the display signal access pad.

In an exemplary embodiment of the present disclosure, the display panel is provided with one first pad and one second pad.

In an exemplary embodiment of the present disclosure, the display panel is provided with one third pad and one fourth pad.

In an exemplary embodiment of the present disclosure, the third pad is connected to the first pad, the fourth pad is connected to the second pad.

In an exemplary embodiment of the present disclosure, the test signal access pad and the first electrode are arranged in the same layer.

In an exemplary embodiment of the present disclosure, the display panel further includes:

A connection line, which is electrically connected to the second pad and the fourth pad.

A plurality of detection lines, which are connected to the connection line, and each of the detection lines is electrically connected to the active region of a row of first transistors respectively.

In an exemplary embodiment of the present disclosure, the first pad is electrically connected to the electrode ring through a conducting wire.

In an exemplary embodiment of the present disclosure, the display panel further includes:

a second transistor, which is formed in the peripheral region of the silicon-based substrate, and includes an active region formed in the silicon-based substrate, two doped regions in the active region, a channel region between the two doped regions and a gate electrode located on the channel region, the two doped regions form a first pole and a second pole respectively; the second pole of the second transistor is electrically connected to the electrode ring, and the first pad is electrically connected to the first pad and the gate electrode of the second transistor.

In an exemplary embodiment of the present disclosure, the driving layer includes:

A gate insulating layer, which is disposed on a channel region on a side of the silicon-based substrate.

A gate layer, which is disposed on a side of the gate insulating layer away from the silicon-based substrate.

A first planarization layer, which is disposed on a side of the silicon-based substrate and is configured to cover the gate insulating layer and the gate layer;

A first conductive layer, which is disposed on a side of the first planarization layer away from the silicon-based substrate.

A dielectric layer, which is provided on a side of the first planarization layer away from the silicon-based substrate and is configured to cover the first conductive layer.

A second conductive layer, which is disposed on a side of the dielectric layer away from the silicon-based substrate.

A second planarization layer, which is disposed on a side of the dielectric layer away from the silicon-based substrate and is configured to cover the second conductive layer, and the first electrode layer is located on a side of the second planarization layer away from the silicon-based substrate.

In an exemplary embodiment of the present disclosure, the display panel further includes:

A first packaging layer, which is disposed on a side of the second electrode layer away from the organic light emitting layer.

A color film layer, which is disposed on a side of the first packaging layer away from the second electrode layer.

A second packaging layer, which is disposed on a side of the color film layer away from the first packaging layer, the third pad and the fourth pad are exposed from the second packaging layer.

According to another aspect of the present disclosure, a display device is provided, the display device includes the display panel described above.

BRIEF DESCRIPTION OF THE DRAWINGS

The accompanying drawings are used to provide a further understanding of the embodiments of the present disclosure, and constitute a part of the specification to be used to explain the present disclosure together with the embodiments of the present disclosure, and do not constitute a limitation of the embodiments of the present disclosure. The above and other features and advantages will become more apparent to those skilled in the art by describing detailed exemplary embodiments with reference to the accompanying drawings. In the accompanying drawings.

DETAILED DESCRIPTION

Exemplary embodiments will now be described more fully with reference to the accompanying drawings. However, the exemplary embodiments can be implemented in various ways, and should not be construed as being limited to the embodiments set forth herein. Instead, these embodiments are provided so that the present disclosure will be comprehensive and complete, and will fully convey the concept of exemplary embodiments to those skilled in the art. The same reference numeral in the accompanying drawings refers to the same or similar structure(s), and thus their detailed descriptions will be omitted.

Although relative terms such as "on" and "below" are used in this specification to describe the relative relationship of one component shown in the drawings to another, these terms are used in this specification only for convenience, for example, the exemplary directions described in the drawings. It can be understood that if the device shown in the drawings is turned over and the device is turned upside down, the components described as "upper" will become "lower" components. When a structure is "on" another structure, it may mean that a certain structure is integrally formed on another structure, or that a certain structure is "directly" disposed on another structure, or that a certain structure is "indirectly" disposed on other structures through another structure.

The terms "one", "a/an", "this/the" and "said" are used to denote the existence of one or more elements/components/ etc. The terms "include" and "have" are used to denote the meaning of open inclusion and refer to the existence of additional elements/components/etc. in addition to the listed elements/components/etc. The terms "first" and "second" are only used as markers and are not a restriction on the number of objects.

The applicant found that with the current advancement of Virtual Reality (VR)/Augmented Reality (AR) technology and the rapid growth of the market, display panels suitable for the VR/AR field are also rushing towards miniaturization, high PPI, fast response and high color gamut, with the advantages of miniaturization and high PPI, silicon-based OLED display panels are becoming a new focus of attention in the VR/AR field.

However, the existing IVL test (characteristic curve tests of current, voltage and brightness) and other test methods are difficult to implement on miniaturized display panels. Specifically, after the OLED vapor deposition is completed, Inline IVL (characteristic curve tests of current, voltage and brightness in the cavity) test is required, and the probe of the Probe Board can be pinned to the Chip Probe (CP), and input the test signal for IVL test. However, there are multiple pairs of pads on the CP, and the IVL test is only for one pair of pads, due to the Layout limitation, there is no area for designing CP. In addition, in the existing design, after completing the IVL test, it needs to go through the primary packaging, color glue, secondary packaging and cover glass (CG) patch, the CP is covered by multiple layers of organic and inorganic materials, and it cannot continue to input test signals through the Pin on the CP. In addition, Module Inspection Test (MIT) can only be tested by pining the probes of the Probe Board on the five pads used to achieve normal display on the FPC/PCB bonding pads.

In this exemplary embodiment, a display panel is first provided, as shown in FIGS. 1 to 7, the display panel 10 includes: a silicon-based substrate 20, a driving layer 30, a first electrode layer, an organic light emitting layer 60, a second electrode layer 70, and a plurality of pads. The silicon-based substrate 20 includes a display region and a peripheral region surrounding the display region; the driving layer 30 is formed in the silicon-based substrate 20 and includes a plurality of first transistors located in the display region; the first electrode layer is disposed on the side of the driving layer 30 away from the silicon-based substrate 20, and includes a plurality of first electrodes 40 located in the display region, and each first electrode 40 is electrically connected to each first transistor; the organic light emitting layer 60 is disposed on the side of the first electrode layer away from the driving layer 30; the second electrode layer 70 is disposed on the side of the organic light emitting layer 60 away from the driving layer 30, and includes a second electrode 720 located in the display region and an electrode ring 710 located in the peripheral region, the electrode ring 710 surrounds the second electrode 720 and is connected to the second electrode 720; a plurality of pads are located in the peripheral region at at least one side of the display region, the plurality of pads include display signal access pads and test signal access pads, and the test signal access pads are located at both sides of the display signal access pads.

The display signal access pad is configured to access the display signal during the display phase, and the test signal access pad is configured to access the test signal during the test phase, the test signal access pads at least include a first group of test phase access pads, and the first group of test phase access pads include a first pad and a second pad, the first pad is electrically connected with the electrode ring, and the second pad is electrically connected with the silicon-based substrate.

As an example, when the display panel is performing an IVL test, the second pad 52 is connected to the VDD (+5V direct current voltage) test signal, and the first pad 51 is connected to the Vcom (−2.5V direct current voltage) test signal. The VDD is connected to the silicon-based substrate area corresponding to each first transistor through a wiring, and the PN junction is turned on through a forward bias, so that the VDD test signal is transmitted to the first electrode 40; at the same time, Vcom transmit a test signal to the second electrode 720 through the electrode ring 710, so that a voltage difference is formed between the first electrode 40 and the second electrode 720, and then the pixel unit is lighted up to perform IVL test and collect test data to achieve the purpose of the IVL test.

The display panel provided by the present disclosure, through the first pad 51 connecting to the electrode ring 710, so as to realize the connection with the second electrode 720; each first electrode 40 is connected to a first transistor, and the silicon-based substrate corresponding to each first transistor is connected to the second pad 52; the test signal is input through the first pad 51 and the second pad 52 to form a voltage difference between the first electrode 40 and the second electrode 720, thereby illuminating the pixel unit, performing an IVL test and collecting test data to achieve the IVL test purpose. In addition, when performing IVL test, it is only necessary to input test signals to the first pad 51 and the second pad 52, the first pad 51 and the second pad 52 are provided on the peripheral region of the silicon-based substrate 20, which occupies a small space and can meet the design requirements of miniaturized silicon-based display panels.

Figure 4:
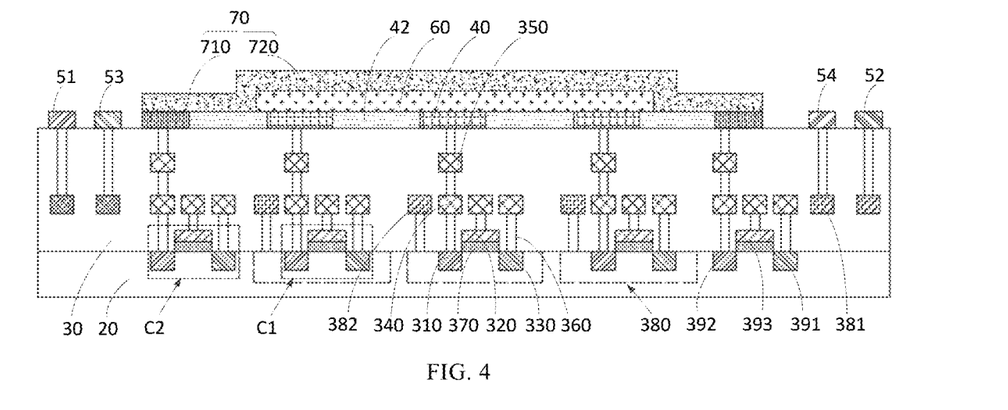
FIG. 4 is a cross-sectional view of the C-C plane in FIG. 1 provided by an embodiment of the disclosure.

Specifically, as shown in FIG. 4, the silicon-based substrate 20 constitutes a silicon-based OLED display panel, the embodiment of the present disclosure provides a top-emission type silicon-based OLED display panel, and C1 in the figure refers to the first transistor, each first transistor includes an active region 380 formed in the silicon-based substrate, two doped regions located in the active region 380, a channel region located between the two doped regions, and a gate electrode 320 located on the channel region. The two doped regions respectively form a first pole 310 and a second pole 330, and the second pad 52 is electrically connected to the active region 380 of each first transistor.

For example, the first transistor is a P-type MOS transistor, the active region 380 is an N-type doped region, and the first pole 310 and the second pole 330 are a P-type doped region on the silicon-based substrate, the second pole 330 of the first transistor is the drain electrode, and the first electrode 310 is the source electrode. The silicon-based substrate corresponding to each first transistor is the active region 380 of the first transistor, and the active region 380 of the first transistor is connected to the VDD test signal through the second pad 52, the PN junction is turned on through the forward bias, so that the VDD test signal is transmitted to the anode. The electrode ring 710 is a cathode ring, and the cathode ring is a ring-shaped wiring that provides a cathode common voltage (negative) at the periphery of the display region, when the cathode is evaporated, it covers the display region and overlaps the cathode ring, thereby providing negative voltage for the common cathode in the entire display region.

As an example, as shown in FIG. 4, the source electrode of the first transistor is connected to the first electrode 40 through the second conductive layer 350 and the first conductive layer 340, through the arrangement of the second conductive layer 350 and the first conductive layer 340, the wiring area is reduced and the resolution is improved. where, the first electrode 40 is electrically connected to the second conductive layer 350 through the contact holes 360, the second conductive layer 350 is electrically connected to the first conductive layer 340 through the contact holes 360, the first conductive layer 340 is electrically connected to the second electrode 330 through the contact holes 360, the gate 320 is electrically connected to the first electrode 310 through the contact holes 360, respectively. Alternatively, the contact hole 360 is a tungsten hole.

Figure 7:
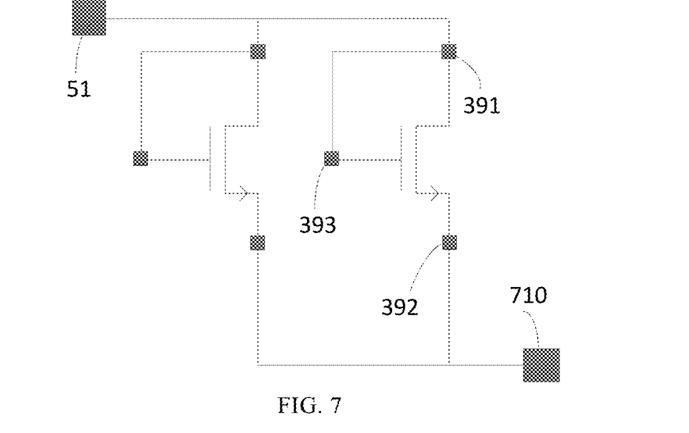
FIG. 7 is a schematic diagram of a circuit for electrically connecting a first pad and an electrode ring provided by an embodiment of the disclosure.

Specifically, C2 in FIG. 4 refers to the second transistor electrically connected to the electrode ring 710, a second transistor is formed in the peripheral region of the silicon-based substrate, including an active region formed in the silicon-based substrate, two doped regions in the active region, a channel region between the two doped regions and a gate electrode 393 located on the channel region, the two doped regions form a first pole 391 and a second pole 392 respectively. As shown in FIG. 7, the second pole 392 of the second transistor is electrically connected to the electrode ring 710, and the first pad 51 is electrically connected to the first pad 391 and the gate electrode 393 of the second transistor. The first pad 51 is electrically connected to the first pole 391 and the gate electrode 393 of the second transistor, so that Vcom is transmitted to the second electrode 720 through the electrode ring 710 and then a voltage difference is formed between the first electrode 40 and the second electrode 720, thereby illuminating the pixel unit to conduct IVL test and collect test data to achieve the purpose of IVL testing. The first pole 391 can be a source electrode, and the second pole 392 can be a drain electrode.

As an example, the first pad 51 may also be electrically connected to the electrode ring 710 through a conducting wire, so that the Vcom can be transmitted to the second electrode 720 through the electrode ring 710, so that a voltage difference is formed between the first electrode 40 and the second electrode 720, and then the pixel unit is lighted to perform an IVL test and collect test data to achieve the purpose of the IVL test. In addition, the first pad 51 and the electrode ring 710 are directly electrically connected through a conducting wire, which reduces the process difficulty.

As shown in FIG. 4, the test signal access pads also include a second group of test phase access pads, and the second group of test phase access pads include a third pad 53 and a fourth pad 54, the third pad 53 is electrically connected to the electrode ring 710, and the fourth pad 54 is electrically connected to the silicon-based substrate. In the display panel provided by the present disclosure, the third pad 53 and the fourth pad 54 are located in the peripheral region and can be exposed from the packaging layer of the display panel, only the third pad 53 and the fourth pad 54 are required for the MIT test of the display panel, which reduces the pin angle required for the MIT test, thereby reducing the required probes and reducing the cost.

Specifically, the peripheral region of the silicon-based substrate includes a bonding area, the third pad 53, the fourth pad 54 and a plurality of display signal access pads are located in the bonding area, and the display signal access pads are the bonding pads 41. Since the display panel is covered with multiple organic and inorganic materials during the packaging process, the first pad 51 and the second pad 52 will be covered, and the MIT test cannot be performed through the first pad 51 and the second pad 52 after packaging. Therefore, the third pad 53, the fourth pad 54 and a plurality of display signal access pads can be simultaneously formed in the bonding area, the third pad 53 and the fourth pad 54 and together with other bonding pads 41 need to be provided with a photoresist layer, and then laser ablation is used to ablate the photoresist layer together with the organic and inorganic materials in the evaporation and packaging process to expose the metal on the surface of each pad to meet the pinning requirements of the MIT test probe boards. The third pad 53 is electrically connected to the electrode ring 710, and the fourth pad 54 is electrically connected to the silicon-based substrate, so that the MIT test is performed through the third pad 53 and the fourth pad 54.

Figure 1:
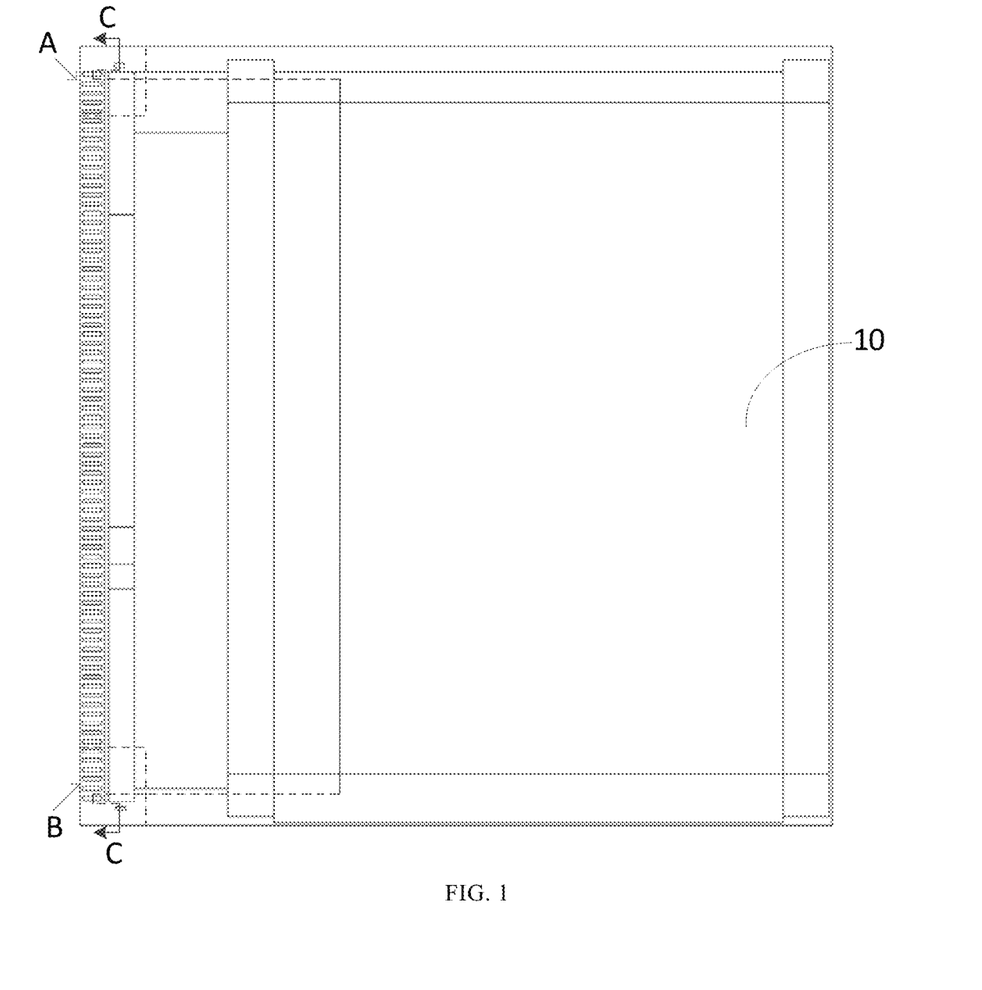
FIG. 1 is a schematic diagram of a display panel provided by an embodiment of the disclosure.
Figure 2:
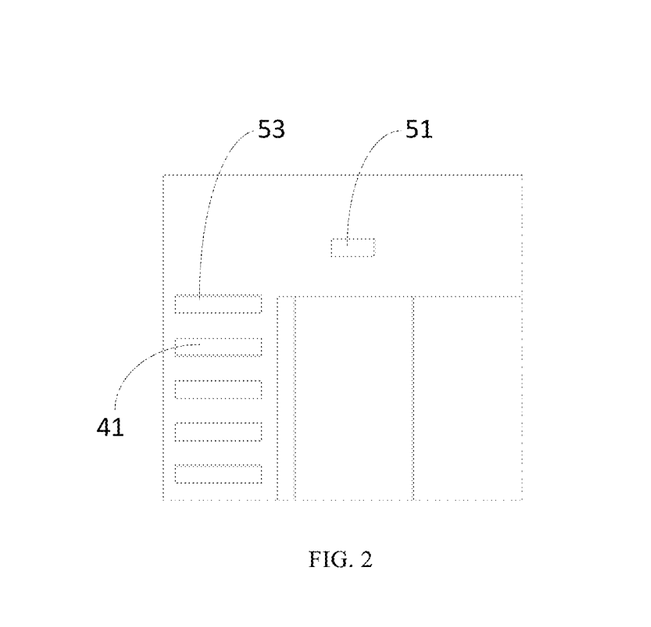
FIG. 2 is an enlarged part of area A in FIG. 1.
Figure 3:
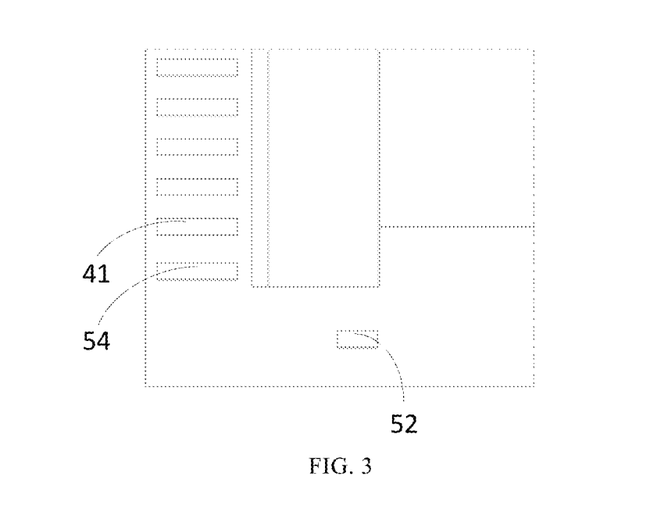
FIG. 3 is an enlarged part of area B in FIG. 1.

As shown in FIGS. 1 to 3, the third pad 53 and the fourth pad 54 are respectively arranged adjacent to the display signal access pads. A plurality of bonding pads 41 are disposed on the bonding area at one side of the silicon-based substrate 20, and each bonding pad 41 is located between the third pad 53 and the fourth pad 54. The third pad 53 and the fourth pad 54 are disposed in the bonding area and located at both ends of the bonding pad 41, which will not affect the layout of the bonding pads 41, the third pad 53, the fourth pad 54 and the bonding pad 41 can be exposed through the same laser ablation process, which reduces the process difficulty and process cost.

As shown in FIG. 1, the first pad 51, the second pad 52, the third pad 53, and the fourth pad 54 are located between the bonding pads 41 and the Flexible Printed Circuit (FPC) Mark, the Mark provides common positionable circuit patterns for all steps in the assembly process of Flexible Printed Circuit (FPC). The first pad 51 and the third pad 53 are located on the same side of the display signal access pads, and the second pad 52 and the fourth pad 54 are located on the other side of the display signal access pads.

Specifically, as shown in FIG. 1, the display panel is only provided with one first pad 51 and one second pad 52, and the second pad 52 is electrically connected to the active region of each MOS transistor. The IVL test can be realized by only two pads, so that the number of pads is minimized, and the layout of the first pad 51 and the second pad 52 on the silicon-based substrate 20 is convenient.

Specifically, as shown in FIG. 1, the display panel 10 is only provided with one third pad 53 and one fourth pad 54, and the fourth pad 54 is electrically connected to the active region of each MOS transistor. The MIT test can be realized by only two pads, so that the number of pads is minimized, and the layout of the third pad 53 and the fourth pad 54 on the silicon-based substrate 20 is convenient.

Specifically, the third pad 53 is connected to the first pad 51. As shown in FIG. 2, the third pad 53 and the first pad 51 can be located on the same side of the silicon-based substrate 20, after the first pad 51 is connected to the electrode ring 710 by a conducting wire, the third pad 53 can be connected to the first pad 51 by a conducting wire, so that the third pad 53 is indirectly connected to the electrode ring 710, which can reduce the number of the conducting wires connecting the electrode ring 710, thereby reducing the difficulty of the fabricating process of the display panel 10.

Specifically, the fourth pad 54 is connected to the second pad 52. As shown in FIG. 3, the fourth pad 54 and the second pad 52 can be located on the same side of the silicon-based substrate 20, after the second pad 52 is connected to each first electrode 40 through a conducting wire, the fourth pad 54 can be connected to the second pad 52 through a conducting wire, so that the fourth pad 54 is indirectly connected to each first electrode 40, which can reduce the number of the conducting wires connecting to each first electrode 40, thereby reducing the difficulty of the fabricating process of the display panel 10.

Specifically, as shown in FIG. 4, the first pad 51, the second pad 52, the third pad 53, and the fourth pad 54 are arranged in the same layer as the first electrode 40. By arranging the first pad 51, the second pad 52, the third pad 53, and the fourth pad 54 on the same layer as the first electrode 40, the first pad 51, the second pad 52, the third pad 53, the fourth pad 54 and the first electrode 40 can be formed through the same process, the form of the first pad 51, the second pad 52, the third pad 53, and the fourth pad 54 is facilitated, and the fabricating process difficulty of the display panel 10 is reduced.

Figure 6:
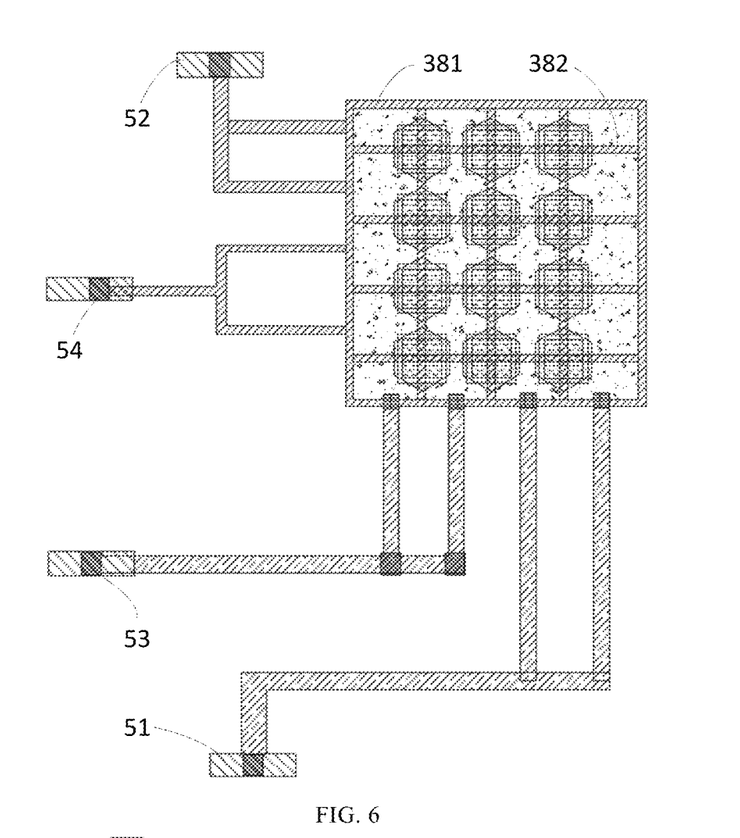
FIG. 6 is a schematic diagram of the connection of the test signal access pad, the first electrode and the second electrode provided by an embodiment of the present disclosure.

Specifically, as shown in FIG. 6, the driving layer 30 further includes: a connection line 381 and a plurality of detection lines 382. The connection line 381 is electrically connected to the second pad 52 and the fourth pad 54; the plurality of detection lines 382 are connected to the connection line 38, and each detection line 382 is electrically connected to the active region of a row of first transistors. The plurality of detection lines 382 are routed in a mesh pattern, which can reduce the influence of loading.

Specifically, the driving layer 30 includes: a gate insulating layer 370, a gate layer, a first planarization layer, a first conductive layer 340, a dielectric layer, a second conductive layer 350, and a second planarization layer. The gate insulating layer 370 is disposed on the side of the silicon-based substrate 20; the gate layer is disposed on the side of the gate insulating layer 370 away from the silicon-based substrate 20; the first planarization layer is disposed on one side of the silicon-based substrate 20 and covers the gate insulating layer 370 and the gate layer; the first conductive layer 340 is disposed on the side of the first planarization layer away from the silicon-based substrate 20; the dielectric layer is provided on the side of the first planarization layer away from the silicon-based substrate 20 and covers the first conductive layer 340; the second conductive layer 350 is disposed on the side of the dielectric layer away from the silicon-based substrate 20; the second planarization layer is disposed on the side of the dielectric layer away from the silicon-based substrate 20 and covers the second conductive layer 350, and the first electrode layer is located on the side of the second planarization layer away from the silicon-based substrate 20. The connection line 381 and the detection lines 382 can be disposed in the same layer as the first conductive layer 340. Of course, the connection lines 381 and the detection lines 382 can also be disposed in layers, and the detection lines 382 and the first conductive layer 340 can be disposed in the same layer; Alternatively, the connection lines 381, the detection lines 382, and the first conductive layer 340 are separately arranged in layers, which is not limited in the present disclosure.

Specifically, as shown in FIG. 4, the display panel further includes a pixel definition layer (PDL) 42, the pixel definition layer 42 is formed with a plurality of openings, and each first electrode 40 is provided in each opening in a one-to-one correspondence. In addition, a PDL is provided between the electrode for connecting the second transistor and the electrode ring 710 and the adjacent first electrode 40 to insulate the electrode from the adjacent first electrode 40.

As an example, the silicon-based OLED display panel provided in the present disclosure may be a white light OLED display panel, and the organic light emitting layer 60 includes a red light emitting layer, a green light emitting layer, and a blue light emitting layer that are sequentially stacked. Of course, the stacking order of the red light emitting layer, the green light emitting layer and the blue light emitting layer can be changed.

Figure 5:
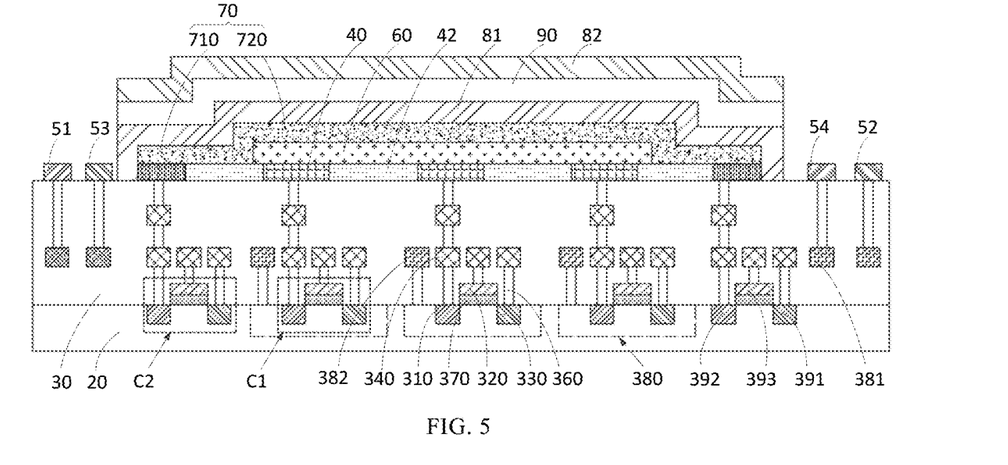
FIG. 5 is a cross-sectional view of the C-C plane in FIG. 1 provided by another embodiment of the disclosure.

Specifically, as shown in FIG. 5, the display panel 10 further includes a first packaging layer 81, a color film layer 90 and a second packaging layer 82. The third pad 53 and the fourth pad 54 are provided with a photoresist layer, and then laser ablation is used to ablate the photoresist layer together with the first packaging layer 81, the color film layer 90 and the second packaging layer 82, so that the surfaces of the third pad 53 and the fourth pad 54 are exposed to meet the pinning requirements of the MIT test probe boards.

Specifically, the display panel 10 further includes a cover glass (not shown in the figures), and the cover glass is disposed on a side of the second packaging layer 82 away from the color film layer 90.

The embodiment of the present disclosure also provides a display device, which includes the display panel described above. The beneficial effects of the display device can be referred to the beneficial effects of the display panel described above, which will not be repeated here. The display device may be, for example, a head-mounted display device such as VR/AR.

Those skilled in the art will easily think of other embodiments of the present disclosure after considering the specification and practicing the disclosure disclosed herein. This application is intended to cover any variations, uses, or adaptive changes of the present disclosure. These variations, uses, or adaptive changes follow the general principles of the present disclosure and include common knowledge or conventional technical means in the technical field not disclosed in the present disclosure. The description and the embodiments are only regarded as exemplary, and the true scope and spirit of the present disclosure are pointed out by the appended claims.

What is claimed is:

1. A display panel, comprising:
    a silicon-based substrate, comprising a display region and a peripheral region surrounding the display region;
    a driving layer, formed in the silicon-based substrate, and comprising a plurality of first transistors located in the display region;
    a first electrode layer, disposed on a side of the driving layer away from the silicon-based substrate, and comprising a plurality of first electrodes located in the display region, and each of the first electrodes is electrically connected to each of the first transistors;
    an organic light emitting layer, disposed on a side of the first electrode layer away from the driving layer;
    a second electrode layer, disposed on a side of the organic light emitting layer away from the driving layer, and comprising a second electrode located in the display region and an electrode ring located in the peripheral region, the electrode ring being configured to surround the second electrode and being connected to the second electrode; and
    a plurality of pads, located in the peripheral region at least one side of the display region, the plurality of pads comprising a display signal access pad and a test signal access pad, and the test signal access pad being located at both sides of the display signal access pad;
    wherein the display signal access pad is configured to access the display signal during a display phase, and the test signal access pad is configured to access the test signal during a test phase, the test signal access pad at least comprises a first group of test phase access pads, and the first group of test phase access pads comprises a first pad and a second pad, the first pad is electrically connected with the electrode ring, and the second pad is electrically connected with the silicon-based substrate.

2. The display panel according to claim 1, wherein each of the first transistors comprises an active region formed in the silicon-based substrate, two doped regions located in the active region, a channel region located between the two doped regions, and a gate electrode located on the channel region, the two doped regions respectively form a first pole and a second pole, and the second pad is electrically connected to the active region of each of the first transistors.

3. The display panel according to claim 2, wherein the driving layer comprises:
    a gate insulating layer, being disposed on the channel region on a side of the silicon-based substrate;
    a gate layer, being disposed on a side of the gate insulating layer away from the silicon-based substrate;
    a first planarization layer, being disposed on a side of the silicon-based substrate and being configured to cover the gate insulating layer and the gate layer;
    a first conductive layer, being disposed on a side of the first planarization layer away from the silicon-based substrate;
    a dielectric layer, being provided on a side of the first planarization layer away from the silicon-based substrate and being configured to cover the first conductive layer;
    a second conductive layer, being disposed on a side of the dielectric layer away from the silicon-based substrate; and
    a second planarization layer, being disposed on a side of the dielectric layer away from the silicon-based substrate and being configured to cover the second conductive layer, and the first electrode layer being located on a side of the second planarization layer away from the silicon-based substrate.

4. The display panel according to claim 2, wherein the test signal access pad also comprises a second group of test phase access pads, and the second group of test phase access pads comprise a third pad and a fourth pad, the third pad is electrically connected to the electrode ring, and the fourth pad is electrically connected to the silicon-based substrate.

5. The display panel according to claim 1, wherein the test signal access pad further comprises a second group of test phase access pads, and the second group of test phase access pads comprise a third pad and a fourth pad, the third pad is electrically connected to the electrode ring, and the fourth pad is electrically connected to the silicon-based substrate.

6. The display panel according to claim 5, wherein the peripheral region comprises a bonding area, the third pad, the fourth pad and a plurality of display signal access pads are located in the bonding area.

7. The display panel according to claim 6, wherein the first pad and the third pad are located on a same side of the display signal access pad, and the second pad and the fourth pad are located on other side of the display signal access pad.

8. The display panel according to claim 6, wherein the third pad and the fourth pad are respectively arranged adjacent to the display signal access pad.

9. The display panel according to claim 5, wherein the first pad and the third pad are located on a same side of the display signal access pad, and the second pad and the fourth pad are located on other side of the display signal access pad.

10. The display panel according to claim 9, wherein the third pad and the fourth pad are respectively arranged adjacent to the display signal access pad.

11. The display panel according to claim 5, wherein the third pad and the fourth pad are respectively arranged adjacent to the display signal access pad.

12. The display panel according to claim 5, wherein the display panel is provided with one first pad and one second pad.

13. The display panel according to claim 12, wherein the display panel is provided with one third pad and one fourth pad.

14. The display panel according to claim 13, wherein the third pad is connected to the first pad, the fourth pad is connected to the second pad.

15. The display panel according to claim 5, wherein the display panel further comprises:
a connection line being electrically connected to the second pad and the fourth pad; and
a plurality of detection lines being connected to the connection line, wherein each of the detection lines is electrically connected to the active region of a row of first transistors respectively.

16. The display panel according to claim 5, wherein the first pad is electrically connected to the electrode ring through a conducting wire.

17. The display panel according to claim 5, wherein the display panel further comprises:
a second transistor formed in the peripheral region of the silicon-based substrate, and comprising an active region formed in the silicon-based substrate, two doped regions in the active region, a channel region between the two doped regions, and a gate electrode located on the channel region, the two doped regions forming a first pole and a second pole respectively; and
the second pole of the second transistor is electrically connected to the electrode ring, and the first pad is electrically connected to the first pad and the gate electrode of the second transistor.

18. The display panel according to claim 5, wherein the display panel further comprises:
a first packaging layer disposed on a side of the second electrode layer away from the organic light emitting layer;
a color film layer disposed on a side of the first packaging layer away from the second electrode layer; and
a second packaging layer disposed on a side of the color film layer away from the first packaging layer, the third pad and the fourth pad being exposed from the second packaging layer.

19. The display panel according to claim 1, wherein the test signal access pad and the first electrode are arranged in the same layer.

20. A display device comprising a display panel, the display panel comprising:
a silicon-based substrate comprising a display region and a peripheral region surrounding the display region;
a driving layer formed in the silicon-based substrate, and comprising a plurality of first transistors located in the display region;
a first electrode layer disposed on a side of the driving layer away from the silicon-based substrate, and comprising a plurality of first electrodes located in the display region, and each of the first electrodes is electrically connected to each of the first transistors in one-one correspondence;
an organic light emitting layer disposed on a side of the first electrode layer away from the driving layer;
a second electrode layer disposed on a side of the organic light emitting layer away from the driving layer, and comprising a second electrode located in the display region and an electrode ring located in the peripheral region, the electrode ring being configured to surround the second electrode and being connected to the second electrode; and
a plurality of pads located in the peripheral region at least one side of the display region, the plurality of pads comprising a display signal access pad and a test signal access pad, and the test signal access pad being located at both sides of the display signal access pad;
wherein the display signal access pad is configured to access the display signal during a display phase, and the test signal access pad is configured to access the test signal during a test phase, the test signal access pad at least comprises a first group of test phase access pads, and the first group of test phase access pads comprises a first pad and a second pad, the first pad is electrically connected with the electrode ring, and the second pad is electrically connected with the silicon-based substrate.

* * * * *